United States Patent [19] [11] 3,749,987
Anantha [45] July 31, 1973

[54] SEMICONDUCTOR DEVICE EMBODYING FIELD EFFECT TRANSISTORS AND SCHOTTKY BARRIER DIODES

[75] Inventor: Narasipur Gundappa Anantha, Hopewell Junction, N.Y.

[73] Assignee: International Business Machines Corporation, Armonk, N.Y.

[22] Filed: Aug. 9, 1971

[21] Appl. No.: 170,181

[52] U.S. Cl. .. 317/235 R, 317/235 G, 317/235 UA, 317/235 AT
[51] Int. Cl. ..... H01l 5/00
[58] Field of Search ..... 317/235, 22.2, 31, 317/48.7

[56] References Cited

UNITED STATES PATENTS

| | | | |
|---|---|---|---|
| 3,576,478 | 4/1971 | Watkins | 317/235 |
| 3,543,052 | 11/1970 | Kahng | 307/238 |
| 3,611,067 | 10/1971 | Oberlin et al. | 317/235 |

*Primary Examiner*—John W. Huckert
*Assistant Examiner*—E. Wojciechowicz
*Attorney*—Wolmar J. Stoffel et al.

[57] ABSTRACT

A semiconductor device having at least one FET and at least one Schottky barrier diode. The device has an FET with source and drain regions in a semiconductor body and a gate electrode. The Schottky barrier diode consists of a thin layer of polycrystalline material separated from the semiconductor body by an insulating amorphous layer, an ohmic contact, and a barrier contact. The combination is particularly useful in fabricating logic and memory devices where the Schottky barrier diode is utilized as a resistance element and/or as an input output device. In the method of producing the device, a polysilicon layer is used to fabricate both the gate electrode and the Schottky barrier diode.

6 Claims, 7 Drawing Figures

PATENTED JUL 31 1973

3,749,987

INVENTORS
NARASIPUR G. ANANTHA
BY Wolmar J. Stoffel
ATTORNEY

SEMICONDUCTOR DEVICE EMBODYING FIELD EFFECT TRANSISTORS AND SCHOTTKY BARRIER DIODES

BACKGROUND OF THE INVENTION

1. Field of the Invention

This invention relates to semiconductor devices and methods of fabricating, more particularly to integrated semiconductor devices wherein the combination of a field effect transistor in a Schottky barrier diode is utilized in the circuitry.

2. Description of the Prior Art

Field effect transistors as well as Schottky barrier diodes are well known in the art. Further, their utilization in various logic and memory circuits are also well known. However, in utilizing the combination of various types of semiconductor element in integrated circuits difficulties have been encountered. Frequently, it is necessary that Schottky barrier diodes and the field effect transistor elements be isolated from each other or from associated elements on the device. This necessitates the employment of an isolation technique of fabrication of either a dielectric region surrounding the device or a diffused region. Such additional steps complicate the fabrication of the field effect transistor since it is highly sensitive to impurities which cause inversion in the gate region resulting in ineffective or inoperative device operations. Further, the additional steps required for isolating the respective devices increase the cost of the device.

SUMMARY OF THE INVENTION

It is an object of this invention to provide an improved integrated circuit semiconductor device which utilizes field effect transistors and Schottky barrier diodes that are insulated from each other.

Another object of this invention is to provide a method for the simultaneous fabrication of FET's and Schottky barrier diodes on a semiconductor device.

Yet another object of this invention is to provide a semiconductor structure having a silicon gate FET and a Schottky barrier diode.

Another object of this invention is to provide a method for fabricating a silicon gate FET, and a Schottky barrier diode that is insulated from the semiconductor body.

Yet another object of this invention is to provide an improved semiconductor device and technique for producing same which utilizes a Schottky barrier diode as a resistance element which results in low power operation.

The semiconductor device of the invention embodying at least one FET and at least one electrically insulated Schottky barrier diode on a body of monocrystalline semiconductor material, an FET having source and drain regions embodied in the body and the gate electrode spanning the source and drain regions having a thin insulating layer on the surface of the body and an overlying layer of doped polycrystalline semiconductor material, a Schottky barrier diode on the device bonded to the top surface of the layer of insulating material, the Schottky barrier diode comprised of a region of polycrystalline semiconductor material, a barrier layer of metal in contact with the region of polycrystalline material, and an ohmic contact.

The method of the invention for fabricating the semiconductor device comprises forming the first insulating layer on the surface of a monocrystalline semiconductor wafer embodying a dopant, forming an opening in the layer, forming a thin insulating layer in at least the opening, depositing a blanket layer of $Si_3N_4$, depositing a layer of polycrystalline material, selectively removing the polycrystalline layer, leaving a portion in the opening to define a gate in at least one portion overlying the first insulating layer, diffusing an impurity into the body forming the source and drain regions while simultaneously including a dopant in the polycrystalline regions, depositing a conductive metal layer and shaping to a desired circuit.

BRIEF DESCRIPTION OF THE DRAWINGS

The foregoing and other objects, features, and advantages of the invention will be apparent from the following more particular description of preferred embodiments of the invention as illustrated in the accompanying drawings.

In the drawings.

DESCRIPTION OF THE PREFERRED EMBODIMENT

Figure 6:
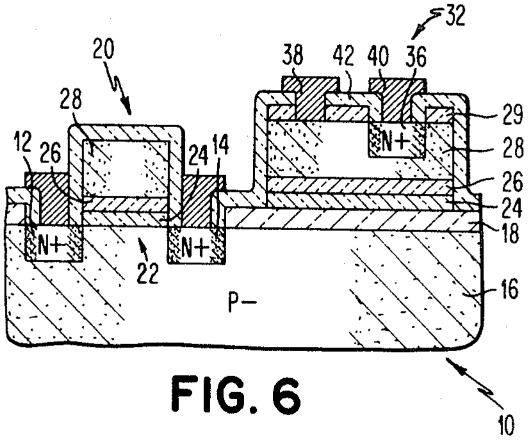

Referring now to FIG. 6 of the drawing, there is illustrated the integrated semiconductor device 10 embodying a field effect transistor 20 and a Schottky barrier diode 32. The use of a Schottky barrier diode with an FET facilitates the fabrication of low power memory and logic circuits. The Schottky barrier diode exhibits relatively high resistance and can therefore be used as a resistor. The space occupied by a Schottky barrier diode is significantly smaller than a conventional diffused resistor used in integrated circuits. It is desirable to provide low power operation because the cost of the primary and back-up power supplies are less when the output is less, the cooling requirements are less stringent, and the design of such a circuit is simplified because the number of low resistance buried regions in bipolar devices is reduced which add significantly to the cost.

The device 10 has source 12 and drain 14 N type regions diffused in a body 16 doped with a P type dopant. Typically semiconductor body 16 has a P type dopant material such as boron or gallium in concentration of $10^{16}$ atoms per cc which results in a resistivity of 15 ohm cm. The surface concentrations of the N type dopant in regions 12 and 14 typically arsenic or phosphorous, are in the range of $10^{19}$ to $10^{21}$ atoms per cc. A surface layer 18 of amorphous inorganic material, as for example silicon dioxide, is provided on the top surface of body 16. Layer 18 can have any suitable thickness but is preferably in the range of 5,000 to 10,000A, and is preferably $SiO_2$. FET 20 has a gate electrode 22 consisting of a thin layer 24, preferably of $SiO_2$, having a thickness in the range of 500 to 1,000A. An overlying layer 26 of $Si_3N_4$ is provided having a thickness in the range of 300 to 1,000A. The conductive portion of electrode 20 is a relative thick layer 28 of doped polysilicon having a thickness in the range of 5,000 to 12,000A. A surface layer 29 of $SiO_2$ provides a covering protection for the electrode, primarily the polysilicon layer 28. The Schottky barrier diode element 32 is mounted on the surface of layer 18 as shown in FIG. 6. The diode has a thin layer 24 of $SiO_2$, an overlying layer 26 of $Si_3N_4$, and a body layer 28 of lightly doped polycrystalline silicon having an N type high conductivity diffused region 36. Layer 28 has embodied therein a suitable dopant, preferably N type with a resistivity of 0.2 to 1 ohm cm. depending on the characteristics of the Schottky diode required. Terminal 38 in contact with polysilicon layer 28 is of a suitable barrier metal or a metal in contact with a barrier metal layer in direct contact with layer 28 which will produce a surface barrier contact. Terminal 40 in electrical contact with a high conductivity diffused region 36 forms an ohmic contact. Preferably the terminals 38 and 40 are of aluminum. Aluminum on polysilicon layer 28 having a resistivity in the range of 0.21 ohm cm. gives a Schottky diode. Any metal like Cr, Ti, Ni, Mo, Ta, and PtSi can be used. Ta, Ti, give low barrier layers suitable for load resistors. Mo and PtSi give high barrier layers suitable for input/output devices.

Figure 1:
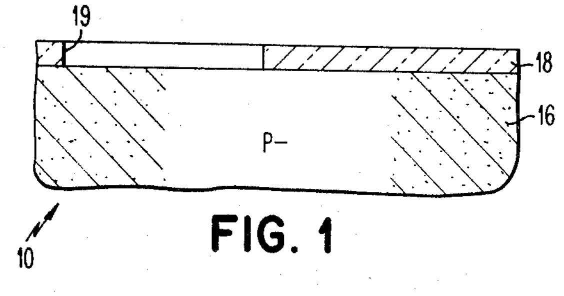
FIGS. 1 through 6 are elevational views in broken cross-section which illustrate the method steps of the invention for producing the structure illustrated in FIG. 6.
Figure 2:
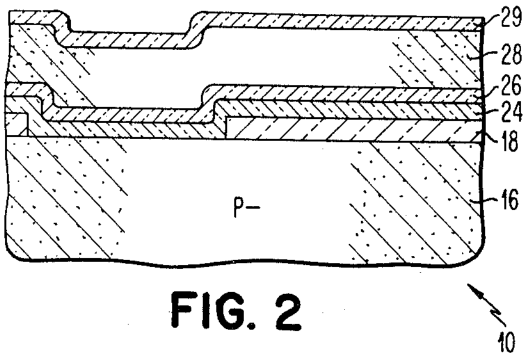
Figure 3:
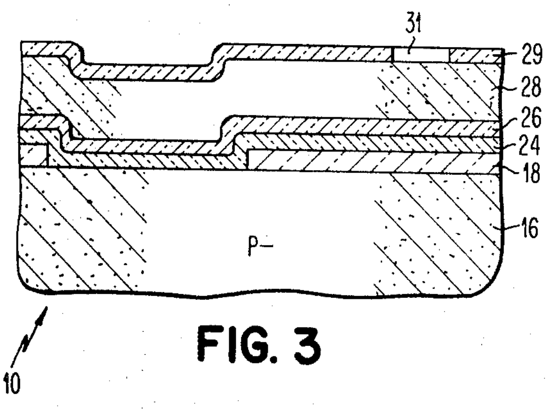
Figure 4:
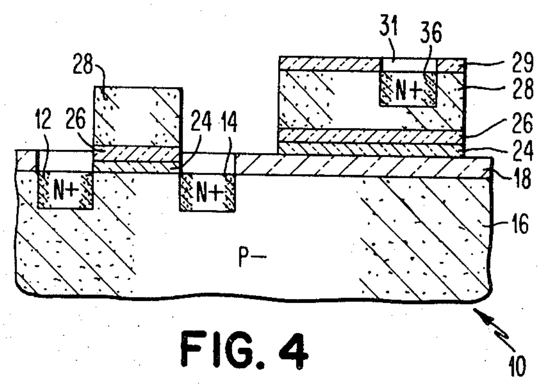
Figure 5:
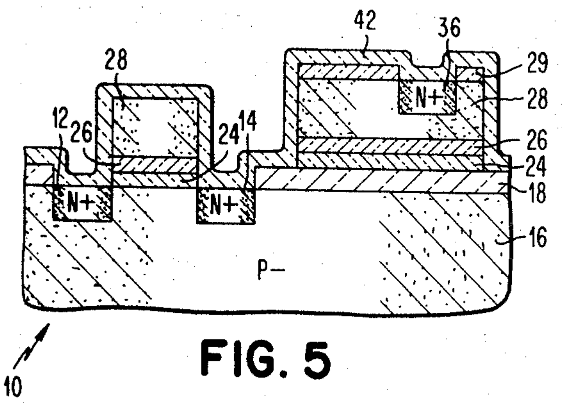

Referring now to FIG. 1 there is depicted the first step of fabricating the device shown in FIG. 6. A layer 18 of $SiO_2$ is formed on body 16 of silicon and an opening 19 formed therein which will ultimately receive the FET structure 20. Layer 18 can be any suitable inorganic amorphous insulating material but is preferably thermal $SiO_2$ having a thickness in the range of 5,000 to 10,000A. Body 16 is preferably a P type wafer but could alternately be an epitaxial layer grown on a monocrystalline semiconductor silicon wafer. As shown in FIG. 2, a thin layer 24 of thermal $SiO_2$ is formed over opening 19 and to a lesser extent on the surface of layer 18. Layer 24 can be formed by conventional thermal oxidation well known to those skilled in the art. $Si_3N_4$ layer 26 is then deposited over layer 24 by any suitable technique such as pyrolytic deposition or reactive sputtering. Layer 26 preferably has a thickness in the range of 300 to 1,000A. It can be conveniently deposited by flowing a mixture of silane and ammonia over the substrate heated to a temperature of 800° to 1,000°C. A layer 28 of polycrystalline silicon is then deposited over the layer 26 by any suitable technique. Layer 28 can be doped with a suitable dopant material as it is grown such that the resistivity is in the range of 0.05 to 2 ohm cm. Either an N or P type dopant can be used which would then dictate the choice of the barrier metal on the Schottky barrier diode. Subsequently, a relatively thin layer 29 of $SiO_2$ is deposited on the surface of the polysilicon layer 28 which can be accomplished by either pyrolytic deposition or thermal oxidation of the polysilicon. An opening 31 is made in oxide layer 29 where the ohmic contact 36 will ultimately be formed. This step is illustrated in FIG. 3 of the drawings. By suitable photolithographic techniques and differential etching, the polysilicon layer 28 is thereafter removed in all the regions except over the gate region and the region which will ultimately form the Schottky barrier diode. The silicon nitride layer 26 and layer 24 are also removed in basically the same areas leaving openings for diffusing in the source and drain. The $SiO_2$ layer 29 is also removed from the polycrystalline silicon gate. Subsequently, the device is exposed to a suitable N type dopant which results in source and drain diffusions 12 and 14, a heavy dopant concentration in the gate, and region 36 in the polycrystalline layer 28. This step is shown in FIG. 4 of the drawings. Following the diffusions, a relatively thin layer 42 is deposited on the surface of the device thereby closing the source and drain openings and opening 31. Subsequently the openings are re-opened and an additional made in the top surface of the diode 32 adjacent the opening 31, and a blanket layer of aluminum evaporated on the surface of the device. Aluminum on 0.2 to 1 ohm cm. polysilicon gives a Schottky diode. However, aluminum deposited on the N+ region 36 gives an ohmic contact. The aluminum metallurgy is formed by conventional photolithographic techniques to provide terminals on the FET 20 and Schottky barrier 32 is shown in FIG. 6 and the contact incorporated into any desired structure on the overall semiconductor device.

Figure 7:
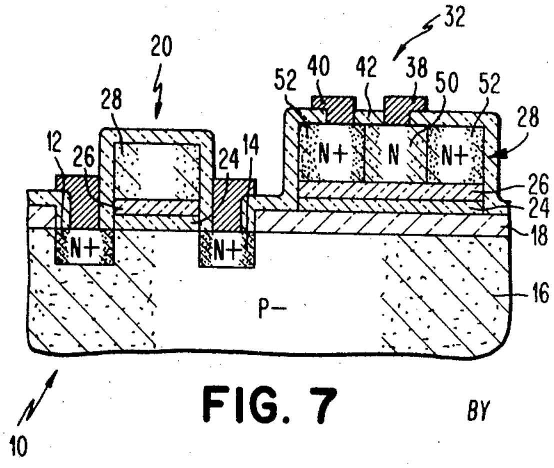
FIG. 7 is an elevational view in broken cross-section showing an alternate embodiment of the invention.

In FIG. 7 there is illustrated an alternate embodiment of the device of the invention which can be produced by a simple modification of the aforedescribed method. The process for producing this device is the same until the stage shown in FIG. 3 is reached. In masking for the diffusion operation, the oxide layer 29 is removed over the polycrystalline layer 28 except in the region where the barrier diode is to be formed. Thus the original low doping concentration is retained under the oxide mask. In FIG. 7 the oxide layer is retained over region 50. The exposed regions of layer 28 therefore receive additional impurity during the diffusion operation described in FIG. 4, resulting in forming of highly doped regions 52, in layer 28 which are suitable for forming ohmic contacts, and also can be used as conductive portions of a circuit associated with the device. An insulating layer 42 is subsequently formed over the polycrystalline layer 28, openings made, and the various terminals and circuit metallurgy formed.

While the invention has been particularly shown and described with reference to preferred embodiments thereof, it will be understood by those skilled in the art that the foregoing and other changes in form or details may be made therein without departing from the spirit and scope of the invention.

What is claimed is:

1. An integrated semiconductor device embodying at least one field effect transistor and at least one electrically insulated Schottky barrier diode comprising, a body of monocrystalline semiconductor material, a field effect transistor having a source and drain region embodied in said body, a gate electrode spanning said source and drain regions having a thin insulating layer on the surface of said body, an overlying layer of doped polycrystalline semiconductor material, and electrically conductive metal terminals to said source and drain regions, a layer of amorphous inorganic insulating material on the surface of said body, a Schottky barrier diode on the body and bonded to the top surface of said layer of insulating material, said Schottky barrier diode comprised of, a region of polycrystalline semiconductor material overlying said layer of insulating material and insulated from said body by said layer, a first metal terminal in electrical contact with said region of polycrystalline material forming a Schottky barrier therewith, and a second terminal in ohmic contact with said polycrystalline semiconductor material.

2. The semiconductor device of claim 1 wherein said body of monocrystalline semiconductor material is a P type material, and said source and drain diffusions in said field effect transistors are N type.

3. The semiconductor device of claim 2 wherein the polycrystalline silicon layer on said Schottky barrier device is P type having a resistivity in the range of 0.2 to 1 ohm cm., and said barrier layer being selected from the group consisting of aluminum, Mo, PtSi, Zr, Ti, Ta, and Mg.

4. The semiconductor device of claim 3 wherein said barrier layer is Al.

5. An improved method for fabricating a semiconductor device having at least a field effect transistor and a Schottky barrier diode thereon comprising, 1. forming a first insulating layer on the surface of a semiconductor wafer embodying a P type dopant,
2. forming an opening in the layer,
3. forming a thin insulating layer in at least the opening,
4. depositing a blanket layer of $Si_3N_4$
5. depositing a layer of polycrystalline semiconductor material over the layer of $Si_3N_4$,
6. selectively removing the polycrystalline semiconductor layer leaving a portion in the opening to define the gate and at least one portion overlying the first insulating layer,
7. forming an inorganic amorphous insulating layer on the top surface of the polycrystalline layer overlying the insulating layer,
8. forming source and drain openings and a diffusion area in said last mentioned layer,
9. introducing an N type impurity into the source and drain openings and through said last mentioned area,
10. forming an insulating layer on the surface of the polycrystalline semiconductor layer and body,
11. forming openings in the layer for contacting the source, drain, gate, high conductivity region in the polycrystalline layer overlying the insulating layer and an opening adjacent thereto, depositing a conductive metal layer, 12. shaping the desired circuit and the contacts to the source drain and Schottky barrier diode including a barrier layer in said last mentioned opening.

6. The method of claim 5 wherein said polycrystalline semiconductor material is silicon.

* * * * *